United States Patent
Kang

(10) Patent No.: US 10,917,104 B2
(45) Date of Patent: Feb. 9, 2021

(54) ADC SAMPLING AND RESOURCE USAGE OPTIMIZATION METHOD USING ACTIVE VARIABLE SAMPLING AND ACTIVE VARIABLE PHASE CONTROL

(71) Applicant: HYUNDAI AUTRON CO., LTD., Seoul (KR)

(72) Inventor: Tae Gyu Kang, Seongnam-si (KR)

(73) Assignee: HYUNDAI AUTRON CO., LTD., Seoul (KR)

( * ) Notice: Subject to any disclaimer, the term of this patent is extended or adjusted under 35 U.S.C. 154(b) by 0 days.

(21) Appl. No.: 16/684,005

(22) Filed: Nov. 14, 2019

(65) Prior Publication Data

US 2020/0162094 A1    May 21, 2020

(30) Foreign Application Priority Data

Nov. 15, 2018   (KR) .................. 10-2018-0140749

(51) Int. Cl.
*H03M 1/12*   (2006.01)

(52) U.S. Cl.
CPC .................. *H03M 1/1245* (2013.01)

(58) Field of Classification Search
CPC ....... H03M 1/12; H03M 1/124; H03M 1/1245
See application file for complete search history.

(56) References Cited

U.S. PATENT DOCUMENTS

| | | | | |
|---|---|---|---|---|
| 5,081,454 A | * | 1/1992 | Campbell, Jr. | G06F 3/05 341/141 |
| 5,331,324 A | * | 7/1994 | Nakajima | H03M 1/1225 341/141 |
| 7,808,413 B2 | * | 10/2010 | Griffith | H03M 1/122 341/141 |
| 9,024,794 B2 | * | 5/2015 | Barrenscheen | H03M 1/0678 341/141 |
| 2011/0102218 A1 | * | 5/2011 | Guido | H03M 1/1225 341/122 |

FOREIGN PATENT DOCUMENTS

| | | |
|---|---|---|
| JP | 2006-148814 A | 6/2006 |
| JP | 2011-160199 A | 8/2011 |
| KR | 10-0266167 B1 | 6/2000 |
| KR | 10-0650956 B1 | 11/2006 |
| KR | 10-0708092 B1 | 4/2007 |
| KR | 10-2011-0075672 A | 7/2011 |
| KR | 10-2013-0060069 A | 6/2013 |
| KR | 10-2015-0055303 A | 5/2015 |

* cited by examiner

*Primary Examiner* — Khai M Nguyen
(74) *Attorney, Agent, or Firm* — Brinks Gilson & Lione

(57) ABSTRACT

An analog to digital converter (ADC) sampling time control method includes: grouping, by an electronic control unit, analog sensor signals received from a plurality of sensors based on a similar signal; setting, by the electronic control unit, a sampling time for converting the grouped analog sensor signals into digital signals; and obtaining, by the electronic control unit, a sensor value by converting the grouped analog sensor signals into the digital signals based on the set sampling time.

9 Claims, 6 Drawing Sheets

ADC SAMPLING AND RESOURCE USAGE OPTIMIZATION METHOD USING ACTIVE VARIABLE SAMPLING AND ACTIVE VARIABLE PHASE CONTROL

CROSS-REFERENCE TO RELATED APPLICATION

This application claims priority to and the benefit of Korean Patent Application No. 10-2018-0140749, filed on Nov. 15, 2018, the entire contents of which are incorporated herein by reference.

FIELD

The present disclosure relates to an Analog to Digital Converter (ADC) sampling and resource usage optimization method using an active variable sampling and an active variable phase control.

BACKGROUND

The statements in this section merely provide background information related to the present disclosure and may not constitute prior art.

As the electrical and electronic technology, the information communication technology, and the like are actively applied to a vehicle technology, the demand for a vehicle controller for controlling various vehicle components such as an engine, a powertrain, and a transmission is increasing day by day.

Therefore, in recent years, a single integrated controller performs a control of the vehicle by integrating a plurality of controllers provided in the vehicle into one controller, and the sensor information desired by the plurality of controllers is processed individually by an Analog to Digital Converter (ADC) in a Micro Controller Unit (MCU) for the vehicle according to each sensor information.

However, we have discovered that if a single ADC processes information received from a lot of sensors arranged in the vehicle to measure various parameters, an excessive load is applied to the MCU and it takes a long time in the process of accurately sampling and processing each of a large amount of analog signals.

SUMMARY

The present disclosure provides an electronic control unit that may integrally control a plurality of controllers.

In another form, the present disclosure provides an analog to digital converter (ADC) sampling time control method that may efficiently process the sensor signals received from a plurality of controllers considering the resource of the MCU in an electronic control unit.

The objects of the present disclosure are not limited to the objects mentioned above, and other objects not mentioned will be clearly understood by those skilled in the art from the following description.

In one form of the present disclosure, an ADC sampling time control method includes: grouping, by an Electronic Control Unit (ECU), analog sensor signals received from a plurality of sensors based on a similar signal; setting, by the electronic control unit, a sampling time for converting the grouped analog sensor signals into digital signals; and obtaining, by the electronic control unit, a sensor value by converting the grouped analog sensor signals into the digital signals based on the set sampling time.

In one form, the ADC sampling time control method may further include, before grouping the analog sensor signals based on the similar signal, confirming, by the electronic control unit, a call time point of the sensor value, and analyzing at least one among a sampling rate, a sampling phase, and a sampling cycle time of the analog sensor signal at the confirmed call time point.

According to an embodiment, the call time point of the sensor value may be a periodic task call time point received by the electronic control unit or a call time point of a non-periodic sensor signal measured by the electronic control unit.

According to another embodiment, the ADC sampling time control method may further include: after obtaining the sensor value, determining, by the electronic control unit, whether a call time point of the sensor value and the set sampling time are switched by monitoring the call time point of the sensor value; and resetting, by the electronic control unit, the sampling time when the monitored call time point and the set sampling time are switched.

According to other embodiment, the setting the sampling time may include: analyzing the start time point in a time domain corresponding to the grouped analog sensor signals; and setting the sampling time sequentially based on the analyzed start time point.

In another form of the present disclosure, an electronic control unit includes: a sensor signal grouping unit configured to group analog sensor signals received from a plurality of sensors based on a similar signal; a timer control unit configured to set a sampling time for converting the analog sensor signals grouped by the sensor signal grouping unit into digital signals; and an Analog Digital Converter (ADC) configured to obtain a sensor value by converting the grouped analog sensor signals into the digital signals based on the sampling time set by the timer control unit.

According to an embodiment, the electronic control unit may further include: a sensor signal characteristic analyzing unit configured to confirm a call time point of the analog sensor signals received from the plurality of sensors, and to analyze a sampling rate or a sampling phase of the analog sensor signals based on the confirmed call time point.

According to another embodiment, the sensor signal characteristic analyzing unit may further include: a periodic call task confirming unit configured to receive a periodic task call time point and confirm the received task call time point; and a non-periodic call task confirming unit configured to receive a non-periodic task call time point and measuring the received non-periodic task call time point.

According to an embodiment, the electronic control unit may further include: an ADC monitoring unit configured to determine whether a call time point is a time point earlier than the sampling time set by the timer control unit by monitoring the call time point of a sampling rate or a sampling phase of the grouped analog sensor signals, and the timer control unit may reset the sampling time when the ADC monitoring unit determines that the call time point is earlier than the set sampling time.

According to an embodiment, the timer control unit may analyze the start time point in a time domain corresponding to the grouped analog sensor signals, and set the sampling time sequentially based on the analyzed start time point.

An ADC sampling time control system according to still another embodiment of the present disclosure includes: a vehicle control device; a vehicle control sensor configured to collect sensor information for controlling the vehicle control device, and an electronic control unit configured to group sensor signals in the sensor information obtained by the vehicle control sensor based on a similar signal. In particular, the electronic control unit is configured to: set a sampling time for converting the grouped analog sensors signal into digital signals, and obtain a sensor value by converting the grouped analog sensor signals into the digital signals based on the set sampling time.

According to an embodiment, the electronic control unit may receive a sensor value call time point from the vehicle control device, and analyze at least one among a sampling rate, a sampling phase, and a sampling cycle time of the analog sensor signals at the received sensor value call time point to select it based on a similar signal.

According to the present disclosure as described above, it is possible to group the sensor signals received by the controllers based on the similar signal, and to perform the ADC conversion according to the grouped characteristics, thereby reducing the load of the MCU for processing the sensor signals.

Further, it is possible to change the ADC sampling time point different for each sensor signal according to the sensor characteristics, thereby preventing the situation of over-obtaining the sensor value unnecessarily, or of under-obtaining it without meeting the sensor requirements.

The effects of the present disclosure are not limited to the effects mentioned above, and other effects not mentioned will be clearly understood by those skilled in the art from the following description.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
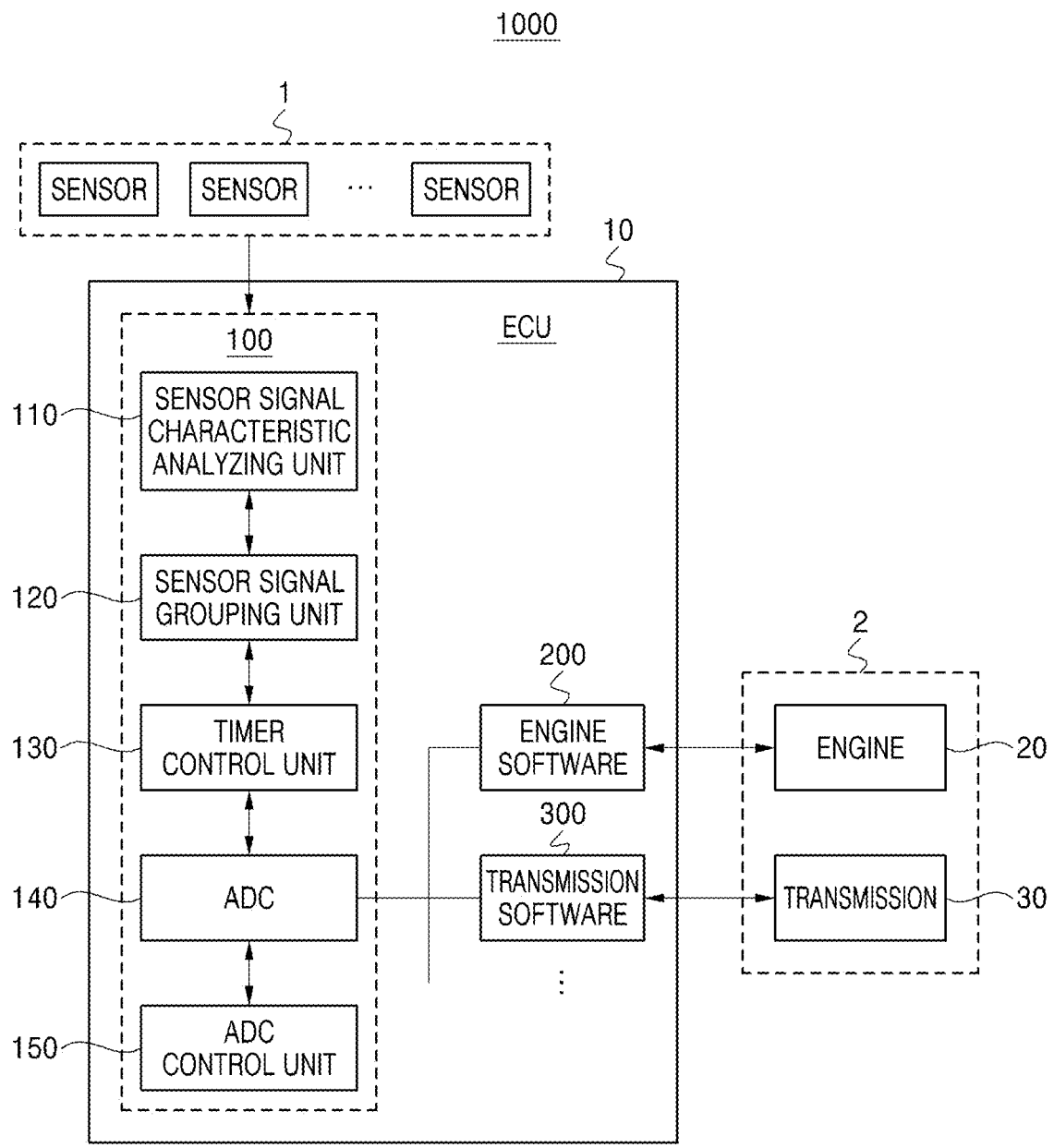
FIG. 1 is a diagram illustrating a configuration of an ADC sampling time control system.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Advantages and features of the present disclosure, and methods for achieving them will be apparent with reference to the embodiments described below in detail in conjunction with the accompanying drawings. However, the present disclosure is not limited to the embodiments disclosed below, but may be implemented in various forms, and only the present embodiments are intended to describe exemplary forms of the present disclosure.

Unless otherwise defined, all terms used in the present specification (including technical and scientific terms) may be used in a sense that may be commonly understood by those skilled in the art to which the present disclosure pertains.

Further, terms that are defined in a commonly used dictionary are not ideally or excessively interpreted unless they are specifically defined clearly. The terminology used herein is for explaining the embodiments and is not intended to limit the present disclosure. In this specification, the singular also includes the plural unless specifically stated otherwise in the phrase.

The "comprises" and/or "comprising" used in the specification does not exclude the presence or addition of one or more other components, steps, operations and/or elements other than the described component, step, operation, and/or element.

Hereinafter, the present disclosure will be described in more detail with reference to the accompanying drawings.

FIG. 1 is a diagram illustrating a configuration of an ADC sampling time control system 1000 according to an embodiment of the present disclosure.

Referring to FIG. 1, it may be confirmed that the ADC sampling time control system 1000 may include an electronic control unit 10 for converting and processing analog sensor signals received from a plurality of vehicle control sensors 1 (hereinafter, referred to as 'sensor') into digital signals, and various vehicle control device 2 for receiving a processing value from the electronic control unit 10 to drive the vehicle.

In one form, the electronic control unit 10 may be a micro controller unit (MCU) 100 implemented with various softwares (for example, an engine software 200 and a transmission software 300) for receiving the signals processed by the MCU 100 to implement an operation of the vehicle control device 2.

In another form, the MCU 100 may include a sensor signal characteristic analyzing unit 110, a sensor signal grouping unit 120, a timer control unit 130, an Analog Digital Converter (ADC) 140, and an ADC monitoring unit 150 in order to process various analog sensor signals, and may further include an additional configuration for achieving the object of the present disclosure.

The sensor signal characteristic analyzing unit 110 may confirm an ADC value call time point received from the vehicle control device 2, and classify the sensor signals for each similar signal according to each ADC value call time point.

Here, the ADC value call time point means the start time point of using the sensor value of each of the vehicle control devices 2, and the sensor signal characteristic analyzing unit 110 may analyze a sampling rate, a sampling phase, a sampling cycle time, which become a reference of the sensor signals based on the same.

Meanwhile, the sampling rate means the number of standardizations per second and the number of samples that should be performed to convert an analog signal into a digital signal, but the sampling rate in the present disclosure is specified to mean a period of performing one-time standardization, that is, an obtaining time interval of the ADC (for example, 1 ms, 5 ms, 10 ms, and the like).

Figure 2:
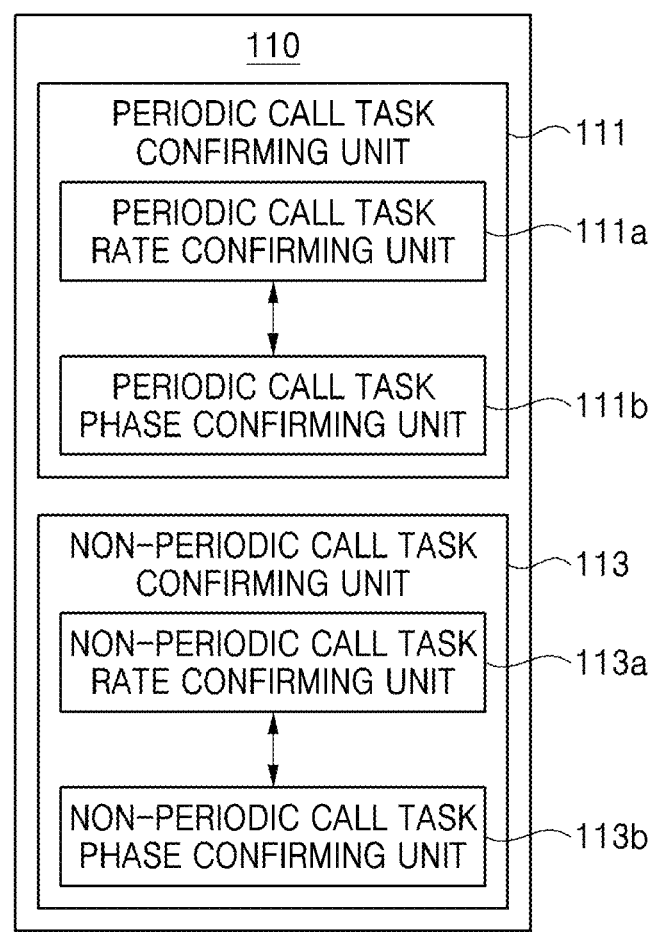
FIG. 2 is a diagram specifying a sensor signal characteristic analyzing unit in an electronic control unit.
Figure 3:
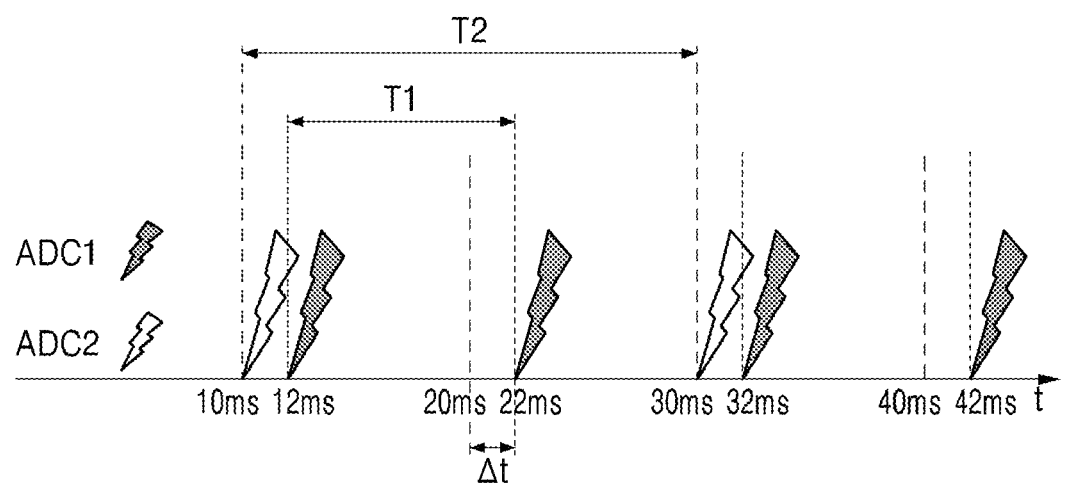
FIG. 3 is a diagram illustrating a sensor signal characteristic analyzing process of a sensor signal characteristic analyzing unit.

FIG. 2 is a diagram specifying the sensor signal characteristic analyzing unit 110 in the electronic control unit 10 according to an embodiment of the present disclosure, and FIG. 3 is a sensor signal characteristic analyzing process of the sensor signal characteristic analyzing unit 110 according to an embodiment of the present disclosure.

Referring to FIG. 2, the sensor signal characteristic analyzing unit 110 may include: a periodic call task confirming unit 111 implemented with a rate confirming unit 111a and a phase confirming unit 111b; and a non-periodic call task confirming unit 113 which includes a rate confirming unit 113a and a phase confirming unit 113b.

More specifically, since there is also a case where the time point at which the vehicle control device 2 uses the sensor value is received periodically, but there is also a case where it is received non-periodically according to the characteristics of the vehicle control device 2, the sampling rate and the sampling phase of the sensor signal may be analyzed by dividing the periodic and non-periodic call time points.

In this regard, referring to FIG. 3, the periodic call task confirming unit 111 may confirm that the call time points received from the engine 20 are 12 ms, 22 ms, and 32 ms to determine that a sampling rate (T1) of the sensor signal utilized by the engine 20 becomes 10 ms, and may obtain the sampling rate of the sensor signal based on a Δt value through a unit of 10 ms, which is a reference. Further, the periodic call task confirming unit 111 may determine that a sampling rate (T2) of the sensor signal becomes 20 ms through the same process for the call time point received from a transmission 30 as well, and obtain the sampling rate of the sensor signal through a unit of 10 ms, which is a reference.

As described above, the periodic call task confirming unit 111 may confirm a periodic task call time point received from each vehicle control device 2, the non-periodic call task confirming unit 113 may measure the task call time point received from the vehicle control device 2 to determine the sampling rate and the sampling phase, and the sensor signal characteristic analyzing unit 110 may select a similar signal based on the determined sampling rate.

Referring back to FIG. 1, the sensor signal grouping unit 120 may group the sensor signals received from a plurality of controllers based on the similar signal described above. That is, a large amount of analog sensor signals received from the plurality of sensors 1 are not processed separately for each signal and may be processed by grouping the signals having a similar sampling rate, thereby reducing or minimizing the usage resource of the MCU 100.

The timer control unit 130 sets a sampling time for converting the grouped analog sensor signal into a digital signal. Here, the sampling time is an obtaining start time for converting an analog signal into a digital signal, and the timer control unit 130 may set the sampling time considering a difference from a sensor value request time of the vehicle control device 2.

Figure 4:
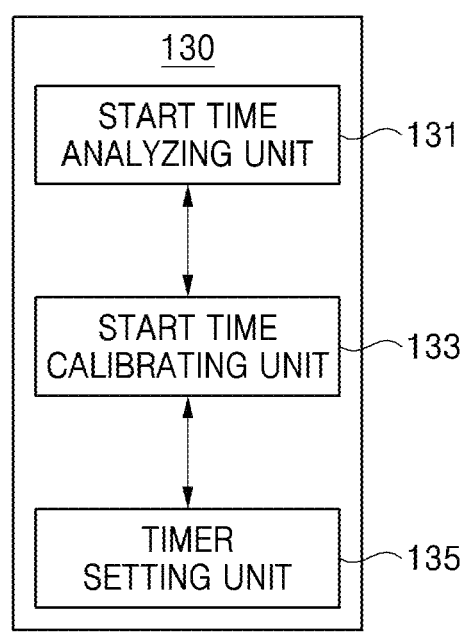
FIG. 4 is a diagram specifying a timer control unit in an electronic control unit.
Figure 5:
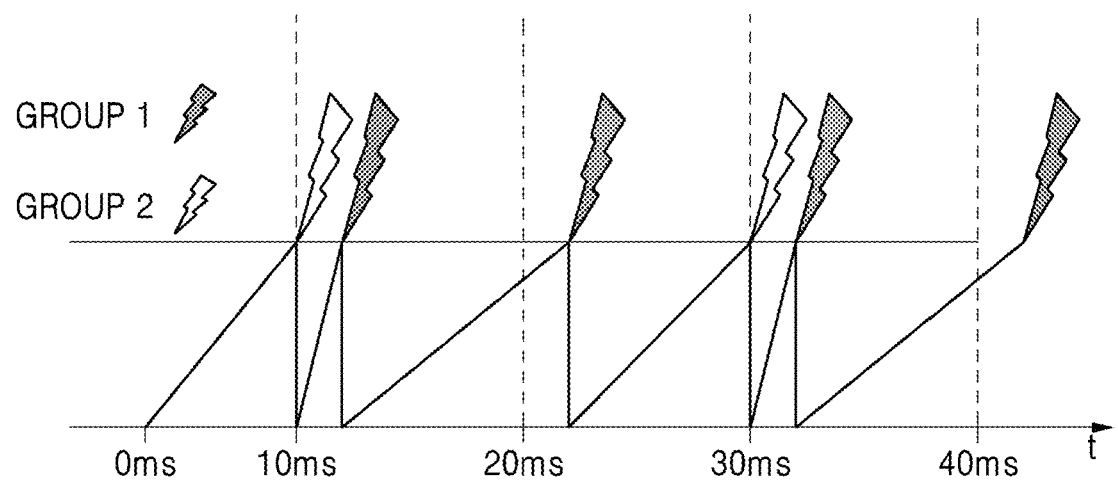
FIG. 5 is a diagram illustrating a sampling time setting process of a timer control unit.

FIG. 4 is a diagram specifying the timer control unit 130 in the electronic control unit 10 according to an embodiment of the present disclosure, and FIG. 5 is a diagram illustrating a sampling time setting process of the timer control unit 130 according to an embodiment of the present disclosure.

Referring to FIG. 4, when being subdivided based on the performing function, the timer control unit 130 is composed of a start time analyzing unit 131, a start time calibrating unit 133, and a timer setting unit 135.

More specifically, the start time analyzing unit 131 may analyze a start time point based on a current time point in the time domain corresponding to the analog sensor signal grouped by the sensor signal grouping unit 120. Therefore, the start time analyzing unit 13 may set the sampling time in the order of the group closest to the start time to provide the sensor value according to the call time point of the vehicle control device 2.

When sensing that the call time point of one or more sensor signals has been changed from the sensor signal characteristic analyzing unit 110 after the sampling time sequence is determined by the start time analyzing unit 131, the start time calibrating unit 133 may provide it to the start time analyzing unit 131 to set the sampling time according to the changed call time point.

The timer setting unit 135 may set the sampling time of the respective sensor signals according to the sampling time sequence set by the start time analyzing unit 131. That is, since the sampling time of the grouped sensor signals is designated and performed in order, the timer setting unit 135 may efficiently perform the digital conversion according to the characteristics of the sensor signal to provide its value even if the vehicle control device 2 needs various and large amounts of sensor values at the same time.

For example, referring to FIG. 5, the sensor signal grouping unit 120 may group the sensor signals into a group 1 having a sampling rate of 10 ms and a group 2 having a sampling rate of 20 ms, and if the start time of the group 2 is earlier in the current time domain, the timer setting unit 135 may first set the sampling time of the group 2 to control so that the analog sensor signals of the group 2 and the group 1 are converted into digital signals sequentially.

The Analog Digital Converter (ADC) 140 may convert the analog sensor signal grouped according to the sampling time set by the timer control unit 130 into a digital signal to obtain the sensor value.

More specifically, the ADC 140 may convert the analog sensor signal grouped according to the sampling time set by the timer control unit 130 into the digital signal, thereby obtaining the digital signal desired for the respective vehicle control devices 2 without exceeding the obtaining value or less than the obtaining value.

The ADC monitoring unit 150 may monitor the ADC value call time point of the vehicle control devices 2 to determine whether the call time point is a time point earlier than the sampling time set by the timer. More specifically, if the call time point is a time point earlier than a predetermined sampling time, each software (for example, the engine software 200 and the transmission software 300) is operated before the ADC 140 obtains and provides the digital signal, and the vehicle control device 2 operates based on the analog sensor signal converted before the current call time point.

Therefore, an error may occur in the operating process of the vehicle control device 2, and the ADC monitoring unit 150 may deliver a signal triggering to reset the sampling time of the corresponding sensor signal through the timer control unit 130 immediately after determining a change in the call time point of the vehicle control device 2.

Until now, the configuration of the ADC sampling time control system 1000 according to an embodiment of the present disclosure has been described. According to one form of the present disclosure, the electronic control unit 10 of the ADC sampling time control system 1000 may group the analog signals received from the plurality of sensors 1 according to the signal characteristics in order to provide a large amount of ADC values requested from various vehicle control devices 2, thereby reducing the load applied to the MCU 100 in the ADC signal processing process, and optimizing the resource usage of the MCU 100. Hereinafter, a method for controlling the ADC sampling time by using the electronic control unit 10 will be described.

Figure 6:
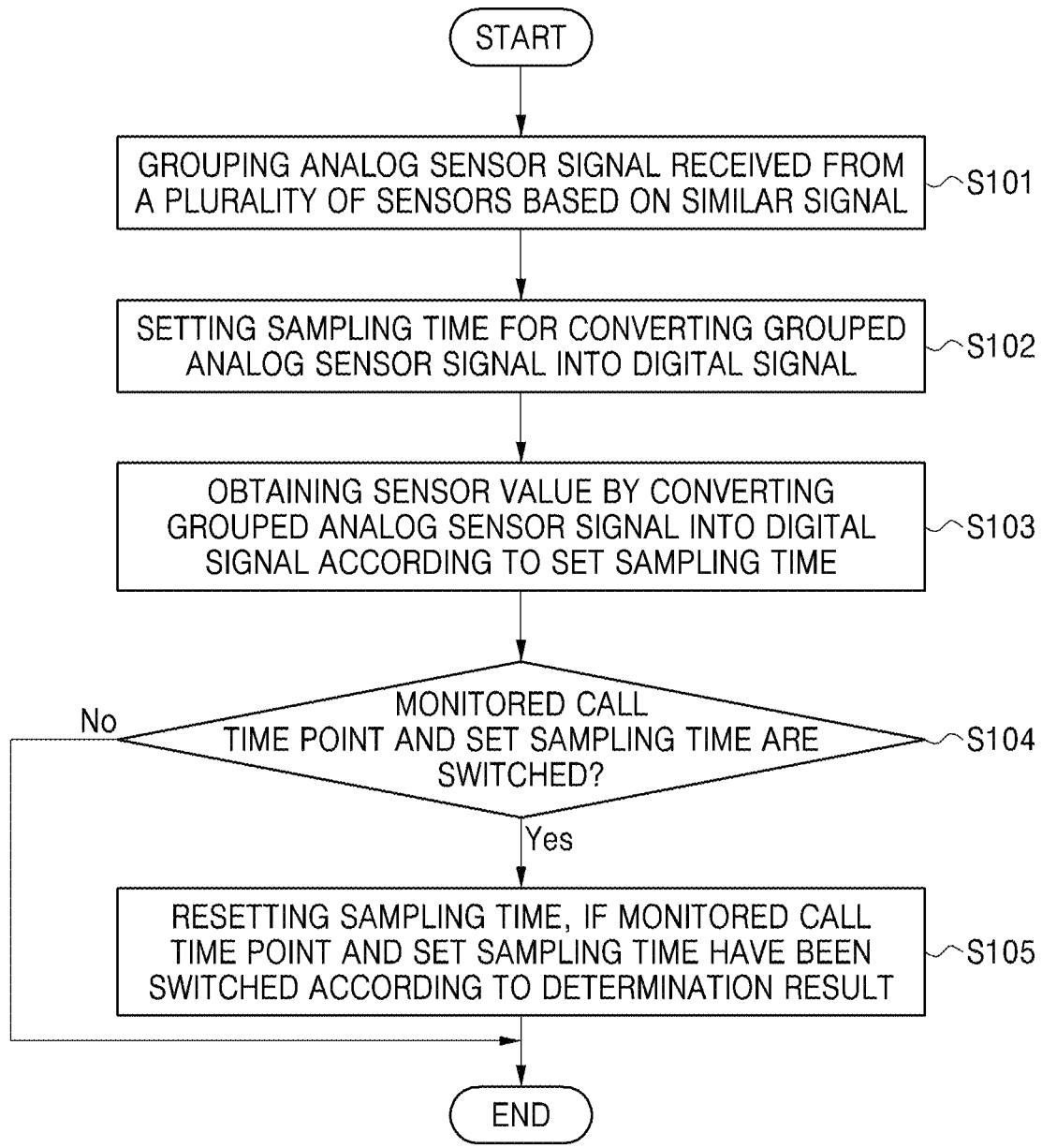
FIG. 6 is a flowchart illustrating a method for controlling a sampling time of an analog sensor signal by using an electronic control unit.

FIG. 6 is a flowchart illustrating a method for controlling an ADC sampling time of an analog sensor signal by using the electronic control unit 10 according to an embodiment of the present disclosure.

Meanwhile, the method illustrated in FIG. 6 is merely one exemplary form for achieving the object of the present disclosure, and it is natural that some operations may be deleted or added as desired, or any one operation may be included in another operation to be performed.

Referring to FIG. 6, the electronic control unit 10 groups analog sensor signals received from the plurality of sensors 1 based on the similar signal (operation S101).

Here, the reference of the similar signal may be selected by using the ADC value call time point of the vehicle control device 2. More specifically, the electronic control unit 10 may analyze the sampling rate, the sampling phase, or the sampling cycle time of the sensor signal by using the periodic or non-periodic ADC value call time point of the vehicle control device 2, and select one of the analyzed results as the reference of the similar signal.

Meanwhile, in the present disclosure, the ADC value call time point of the vehicle control device 2 means the start time of using the sensor value of the vehicle control devices 2, and the group may be divided into groups having the sampling rates of 1 ms, 5 ms, 10 ms, 20 ms, 100 ms according to the ADC value call time point.

After the operation S101, the electronic control unit 10 sets a sampling time for converting the grouped analog sensor signal into a digital signal (operation S102).

At this time, the sampling time may be an obtaining start time point that starts to convert the analog sensor signal into a digital signal, and the obtaining start time point may be a time point earlier than the ADC value call time point of the vehicle control device 2. Further, thereafter, since a predetermined time is taken even in the process of converting the analog sensor signal into the digital signal according to the sampling time, the electronic control unit 10 may set the sampling time considering the predetermined time.

After the operation S102, the electronic control unit 10 obtains a sensor value by converting the grouped analog sensor signal into the digital signal according to the set sampling time (operation S103).

That is, the electronic control unit 10 may perform sampling to correspond to the ADC value call time point of the vehicle control devices 2, and implement more precise vehicle control by delivering the sensor value according to the time point at which the vehicle control device 2 is driven.

While the operation S103 is repeatedly performed, the electronic control unit 10 monitors the ADC value, that is, the sensor value call time point of the vehicle control device 2, and determines whether the monitored call time point and the previously set sampling time are switched (operation S104).

As described above, if the sensor value call time point becomes a time point earlier that the predetermined sampling time, the sensor value obtained before the current time point may be provided to the vehicle control device 2. Therefore, since the possibility of an error occurring in the operation control process of the vehicle increases, the sensor value call time point of the vehicle control device 2 may be continuously monitored.

According to the determination result in the operation S104, if the call time point and the sampling time have been switched, the electronic control unit 10 resets the sampling time (operation S105, YES), and conversely, if they are not switched, ends the ADC conversion process.

Until now, the ADC sampling time control method according to an embodiment of the present disclosure has been described. According to the present disclosure, in the process of processing the analog sensor signal measured by a large number and a large amount of sensors in one MCU 100 by integrating the controllers, it is possible to group and process the analog sensor signals, and to continuously monitor the call time point changed according to the vehicle control characteristics, thereby varying the sampling rate and the sampling phase as desired for the vehicle control device 2, and reducing or minimizing the occurrence of error in the vehicle control process.

Although embodiments of the present disclosure have been described above with reference to the accompanying drawings, those skilled in the art to which the present disclosure pertains will understand that the present disclosure may be embodied in other specific forms without changing the technical spirit or features thereof. Therefore, it should be understood that the embodiments described above are exemplary in all respects and not restrictive.

What is claimed is:

1. An analog to digital converter (ADC) sampling time control method, comprising:
   confirming, by an electronic control unit, a call time point of a sensor value;
   analyzing, by the electronic control unit at the confirmed call time point, at least one among a sampling rate, a sampling phase, and a sampling cycle time of analog sensor signals received from a plurality of sensors;
   grouping, by an electronic control unit, the analog sensor signals received from the plurality of sensors based on the sampling rate;
   setting, by the electronic control unit, a sampling time for converting the grouped analog sensor signals into digital signals; and
   obtaining, by the electronic control unit, the sensor value by converting the grouped analog sensor signals into the digital signals based on the set sampling time.

2. The ADC sampling time control method of claim 1, wherein the call time point of the sensor value is a periodic task call time point received by the electronic control unit or a call time point of a non-periodic sensor signal measured by the electronic control unit.

3. The ADC sampling time control method of claim 1, further comprising:
   after obtaining the sensor value,
   determining, by the electronic control unit, whether a call time point of the sensor value and the set sampling time are switched by monitoring the call time point of the sensor value; and
   resetting, by the electronic control unit, the sampling time when the monitored call time point and the set sampling time are switched.

4. The ADC sampling time control method of claim 1, wherein setting the sampling time includes:
   analyzing a start time point in a time domain corresponding to the grouped analog sensor signals, and
   setting the sampling time sequentially based on the analyzed start time point.

5. An electronic control unit, comprising:
   a sensor signal grouping unit configured to group analog sensor signals received from a plurality of sensors based on a sampling rate;

a timer control unit configured to set a sampling time for converting the analog sensor signals grouped by the sensor signal grouping unit into digital signals; and an Analog Digital Converter (ADC) configured to obtain a sensor value by converting the grouped analog sensor signals into the digital signals based on the sampling time set by the timer control unit, wherein the timer control unit is configured to analyze a start time point in a time domain corresponding to the grouped analog sensor signals, and set the sampling time sequentially based on the analyzed start time point.

6. The electronic control unit of claim 5, further comprising:

a sensor signal characteristic analyzing unit configured to confirm a call time point of the analog sensor signals received from the plurality of sensors, and analyze the sampling rate or a sampling phase of the analog sensor signals based on the confirmed call time point.

7. The electronic control unit of claim 6, wherein the sensor signal characteristic analyzing unit further comprises:

a periodic call task confirming unit configured to receive a periodic task call time point, and confirm the received task call time point; and a non-periodic call task confirming unit configured to receive a non-periodic task call time point, and measure the received non-periodic task call time point.

8. The electronic control unit of claim 5, further comprising: an ADC monitoring unit configured to determine whether a call time point is a time point earlier than the sampling time set by the timer control unit by monitoring the call time point of the sampling rate or a sampling phase of the grouped analog sensor signals, wherein the timer control unit is configured to reset the sampling time when the call time point is earlier than the set sampling time.

9. An analog to digital converter (ADC) sampling time control system, comprising:

a vehicle control device;

a vehicle control sensor configured to collect sensor information for controlling the vehicle control device; and an electronic control unit configured to:

receive a sensor value call time point from the vehicle control device, and analyze and select at least one among a sampling rate, a sampling phase, and a sampling cycle time of analog sensor signals in the sensor information at the received sensor value call time point, group the analog sensor signals in the sensor information collected by the vehicle control sensor based on the sampling rate, set a sampling time for converting the grouped analog sensor signals into digital signals, and obtain a sensor value by converting the grouped analog sensor signals into the digital signals based on the set sampling time.

* * * * *